(12) United States Patent
Tombler, Jr. et al.

(10) Patent No.: US 7,926,440 B1
(45) Date of Patent: Apr. 19, 2011

(54) NANOSTRUCTURE SYNTHESIS APPARATUS AND METHOD

(75) Inventors: Thomas W. Tombler, Jr., Goleta, CA (US); Jon W. Lai, Santa Barbara, CA (US); Brian Y. Lim, Simi Valley, CA (US); Borys Kolasa, Santa Barbara, CA (US)

(73) Assignee: Etamota Corporation, Pasadena, CA (US)

( * ) Notice: Subject to any disclaimer, the term of this patent is extended or adjusted under 35 U.S.C. 154(b) by 281 days.

(21) Appl. No.: 11/288,951

(22) Filed: Nov. 28, 2005

Related U.S. Application Data

(60) Provisional application No. 60/631,237, filed on Nov. 27, 2004.

(51) Int. Cl.
*B05C 13/00* (2006.01)
*D01F 9/133* (2006.01)
*D01F 9/127* (2006.01)

(52) U.S. Cl. ............... 118/59; 423/447.3; 422/202

(58) Field of Classification Search ............... 423/447.1, 423/447.3; 422/200, 235, 202, 186; 118/58, 118/69, 724

See application file for complete search history.

(56) References Cited

U.S. PATENT DOCUMENTS

| | | | | |
|---|---|---|---|---|
| 5,059,770 | A * | 10/1991 | Mahawili | 219/391 |
| 5,156,815 | A * | 10/1992 | Streetman et al. | 422/129 |
| 6,080,970 | A * | 6/2000 | Yoshida et al. | 219/444.1 |
| 6,156,382 | A * | 12/2000 | Rajagopalan et al. | 427/250 |
| 6,181,055 | B1 | 1/2001 | Patterson et al. | |
| 6,184,498 | B1 * | 2/2001 | Kiyama | 219/390 |
| 6,232,706 | B1 | 5/2001 | Dai et al. | |
| 6,346,189 | B1 | 2/2002 | Dai et al. | |
| 6,495,258 | B1 * | 12/2002 | Chen et al. | 428/408 |
| 6,676,906 | B1 * | 1/2004 | Heisel | 422/190 |
| 6,692,568 | B2 | 2/2004 | Cuomo et al. | |
| 2002/0011210 | A1 * | 1/2002 | Satoh et al. | 118/715 |
| 2006/0269468 | A1 * | 11/2006 | Chung et al. | 423/447.3 |

OTHER PUBLICATIONS

Qin, et al., Growing carbon nanotubes by microwave plasma-enhanced chemical vapor deposition, Applied Physics Letters 1998; 72(26): 3437-3439.*

Lee, et al., Growth and field emission of carbon nanotubes on sodalime glass at 550 C using thermal chemical vapor deposition, Chemical Physics Letters 2001; 337: 398-402.*

R. Alexandrescu et al., "Synthesis of Carbon Nanotubes by CO2 laser-assisted Chemical Vapour Deposition," Infrared Physics & Technology, 44, (2003) 43-50.

F. Rohmund et al., "Carbon Nanotube Films Grown by Laser-assisted Chemical Vapor Deposition," J. of Vacuum Science and Technology B, vol. 20, No. 3, (2002) 802-11.

P. Finnie et al., "Cold Wall Chemical Vapor Deposition of Single Walled Carbon Nanotubes," J. of Vacuum Science and Technology A, vol. 22, No. 3, (2004) 747-51.

(Continued)

*Primary Examiner* — Stanley S. Silverman
*Assistant Examiner* — Daniel C. McCracken
(74) *Attorney, Agent, or Firm* — Aka Chan LLP

(57) ABSTRACT

Apparatus and method for synthesizing nanostructures in a controlled process. An embodiment of the apparatus comprises a stage or substrate holder that is heated, e.g., resistively, and is the primary source of heating for the substrate for nanostructure synthesis. The substrate and substrate heater are enclosed in a chamber, e.g., a metal chamber, which is ordinarily at a lower temperature than are the substrate and substrate heater during synthesis. Some embodiments of the invention are particularly useful for chemical vapor deposition (CVD), low pressure CVD (LPCVD), metal organic CVD (MOCVD), and general vapor deposition techniques. Some embodiments of the present invention allow for in situ characterization and treatment of the substrate and nanostructures.

38 Claims, 7 Drawing Sheets

OTHER PUBLICATIONS

O. Englander et al., "Local Synthesis of Silicon Nanowires and Carbon Nanotubes on Microbridges," Applied Physics Letters, vol. 82, No. 26 (Jun. 30, 2003) 4797-4799.

S. Chiashi et al., "Cold Wall CVD Generation of Single-Walled Carbon Nanotubes and In Situ Raman Scattering Measurements of the Growth Stage," Chemical Physics Letters, 386 (2004) 89-94.

Wei al. "Directed Assembly of Carbon Nanotube Electronic Circuits by Selective Area Chemical Vapor Deposition on Prepatterned Catalyst Electrode Structures," J. of Vacuum Science and Technology B, 18, (2000), 3586-89.

Avigal, Y. and Kalish, R. "Growth of Aligned Carbon Nanotubes by Biasing During Growth," Applied Physics Letters, vol. 78, No. 16 (2001) 2291-93.

Lan et al., "Nanohomojunction (GaN) and Nanoheterojunction (InN) Nanorods on One-Dimensional GaN Nanowire Substrates," Advanced Functional Materials, 14, No. 3 (2004) 233-37.

* cited by examiner

NANOSTRUCTURE SYNTHESIS APPARATUS AND METHOD

RELATED APPLICATION(S)

The present patent application is related to and claims the benefit of priority from commonly-owned U.S. Provisional Patent Application No. 60/631,237, filed on Nov. 27, 2004, entitled "Nanostructure Synthesis Apparatus and Method", which is hereby incorporated by reference in its entirety for all purposes.

TECHNICAL FIELD

Some embodiments of the present invention relate to the synthesis of nanostructures using a stage reactor heating system within a chamber, e.g., a metal chamber. Some embodiments of the invention are particularly suited for the fabrication of nanowires, nanoribbons, nanorods, single-walled carbon nanotubes (SWNT), double-walled carbon nanotubes (DWNT), non-carbon nanotubes, or the like.

BACKGROUND

There has been a great deal of interest in nanotechnology over the last decade. Particularly, quasi-one dimensional structures with two dimensions in the nanoscale (e.g. width and height) are fascinating for fundamental research and potential application in commercial products. These structures include carbon nanotubes, such as single-wall nanotubes (SWNT) and double-wall nanotubes (DWNT), and semiconducting nanowires and nanostructures. The SWNT and DWNT are hollow with all carbon shells. SWNT are promising for sensing, transistor, and logic application. DWNT are promising materials for long lasting field emission components for display technologies. Non-carbon nanotubes have also been developed including boron nitride nanotubes. Nanowires, nanoribbons, nanorods, and similar nanostructures include silicon, germanium, gallium nitride, zinc oxide, tin oxide, indium oxide, and other III/V, II/VI, and group IV structures. Most of these structures can be doped and modified to further increase their applicability.

The synthesis of these nanostructures is most often preformed in hot wall reactors, such as quartz or alumina tube furnaces. In this process the reactor walls, substrate, precursor materials, and any catalyst are all heated to high temperatures.

Two examples of the use of hot wall reactors for the synthesis of nanostructures are disclosed by Dai et al. for the synthesis of SWNT from catalyst islands and for the synthesis of MWNT towers, both by hot wall reactor CVD. The SWNT process is disclosed in U.S. Pat. No. 6,346,189, entitled "Carbon Nanotube Structures Made Using Catalyst Islands", where iron oxide on alumina is deposited on substrates as catalyst islands. SWNT are grown between islands and on the substrate. In U.S. Pat. No. 6,232,706, entitled "Self-Oriented Bundles of Carbon Nanotubes and Methods of Making Same", Dai describes the synthesis of MWNT on iron thin films on porous silicon. Towers of vertically aligned MWNT are grown.

Cold wall reactors have been used to fabricate multi-walled carbon nanotubes (MWNT) by plasma enhanced CVD (PECVD). The plasma is in direct contact with the substrate and can heat the substrate to the required temperature, as well as ionize the gas precursors for efficient MWNT synthesis. One advantage is vertical alignment of the MWNT with the electric field created by the plasma. While these processes are cold wall, they require complicated plasma equipment and formation and have only been successful in MWNT. It is likely that the conditions are too harsh for other nanostructures, such as SWNT or DWNT.

A different and non-global heating approach is described in two articles: Alexandrescu et al. "Synthesis of Carbon Nanotubes by CO2-Laser-Assisted Chemical Vapor Deposition", Infrared Physics and Technology, 44, (2003), 43-50; and Rohmund et al. "Carbon Nanotube Films Grown by Laser-Assisted Chemical Vapor Deposition", Journal of Vacuum Science and Technology B, 20, (2002), 802-811. In this approach described by these articles, a single-CO2 laser is used to locally irradiate (heat) an area on a substrate in the presence of catalytic species and hydrocarbon gas. The laser heats the substrate. The laser also heats the gas through the use of C2H4 included with the gas, which absorbs some of the CO2 laser radiation and heats other, non-absorbant gases within the gas by collisional energy exchange. This technique produces MWNT films of varying yields and defect densities, as well as occasional SWNT. Unfortunately, a drawback of this approach is that the yield and quality are not well controlled. The nanotube synthesis is not uniform, most likely due to difficulty in controlling the laser heating of the substrate, which is the primary heating source. Rohmund uses a secondary heating source of the substrate, to raise the starting temperature of the substrate. The laser is the primary heating source used for nanotube synthesis. While this method does have some of the advantages of a non-hot wall reactor, it requires complicated laser heating of the substrate and catalyst, is difficult to control heating, requires selected substrate materials, and is limited in applicability.

Finnie et al. (Journal of Vacuum Science and Technology A, 22, 2004, 747) describes the synthesis of SWNT by using a direct current to heat the samples themselves, on which catalyst particles are deposited. The substrates were unpatterned silicon with iron oxide nanoparticles. Englander et al. (Applied Physics Letters, 82, 2003, 4797) uses resistive heating of silicon microbridges with metal catalyst thin films to synthesize silicon nanowires and MWNT. The microbridges, which are several microns wide, experience localized Joule heating as their reduced size makes them more resistive than the large silicon connecting pads. Wirebonds are used to connect to the large silicon pads and provide the voltage source. Chiashi et al. (Chemical Physics Letters, 386, 2004, 89) describes a similar method for the synthesis of SWNT with ethanol vapor and Joule heating of a silicon substrate to 850 degrees Centigrade. The catalyst, Fe/Co on zeolite, is deposited on the silicon, and the silicon substrate is clamped on two opposing sides. An ac voltage of typically 6 V is applied to the silicon. While these methods have the advantage of cold wall reactors such as only heating the sample and not the entire reactor, capability of rapid heating and cooling, and possible localization of heating, there are some limitations. The substrate is limited to a conducting or semiconducting material, such as silicon, in order to effectively heat it by Joule heating. Silicon is the only material used, and this will likely restrict the versatility of the technique. The clamps or electrodes used to supply the voltage source will take up a given area on the substrate, and hence reduce the effective space for nanostructure synthesis. There is also a possibility of contamination due to the extreme local nature of the clamps, wirebonds, or electrodes.

In U.S. Pat. No. 6,181,055, entitled "Multilayer Carbon-Based Field Emission Electron Device for High Current Density Applications", Patterson et al. discloses a carbon deposition process for carbon films via a CVD or physical vapor deposition (PVD) method. This method is solely used for carbon thin film deposition with no attempt to make any well organized arrangement of carbon atoms. Hence, it is used for amorphous carbon films and not relevant for nanostructure synthesis.

In U.S. Pat. No. 6,692,568, entitled "Method and Apparatus for Producing MIIIN Columns and MIIIN Materials Grown Thereon", Cuomo et al. describes a sputter transport method used to produce arrays or layers of columnar structures of single crystal Group III nitride on substrates. The substrate rests on a substrate holder that is also the primary anode for sputtering. The substrate holder can be heated or cooled in order to modify the temperature of the substrate. The material for column growth is provided by sputtering techniques which has limitations if one were to attempt to extend the process for nanostructure synthesis. The need for sputtering of a solid target is complicated, and the sputtering sources are limited to certain materials.

Another method of cold wall CVD is through halogen lamp rapid thermal heating. In this process, the halogen lamps are heated and irradiate the sample or sample holder with infrared radiation (IR). The lamps are usually, but not always, outside of the reactor. This is a cold wall technique. However, it is limited in use as it requires radiation heating which limits its temperature maximum, often involves halogen lamp burnout, and requires either the substrate or substrate holder to absorb the IR. There are also design limitations on the chamber and overall process.

The synthesis of MWNT in cold wall chambers is described in two articles: Wei et al. "Directed Assembly of Carbon Nanotube Electronic Circuits by Selective Area Chemical Vapor Deposition on Prepatterned Catalyst Electrode Structures," Journal of Vacuum Science and Technology B, 18, (2000), 3586-3589; and Avigal and Kalish "Growth of Aligned Carbon Nanotubes by Biasing During Growth." Wei et al. describes the synthesis of MWNT with iron thin films patterned on oxide coated silicon wafers. The substrate is heated to 660 degrees Centigrade in a stainless steel chamber and acetylene is used as the carbon feedstock. Avigal and Kalish describe a quartz cold wall reactor with a molybdenum substrate holder used to heat the substrate and an electrical bias on the substrate. The bias is required for MWNT growth. While these techniques are used to synthesize MWNT with diameters as low as 10 nm, it is unclear whether they will work for other nanostructures. There are limitations in nanostructure growth, quality, and defect density.

Lan et al. (Advanced Functional Materials, 14, 2004, 233) presents the synthesis of gallium nitride and indium nitride nanorods grown on gallium nitride nanowires. The growth of gallium nitride is done with conventional quartz tube furnace methods. Lan also describes the MOCVD synthesis of the indium nitride nanorods with a cold wall quartz tube chamber and a substrate heater, where the growth occurred at 500 degrees Centigrade. The MOCVD cold wall system described in the article will likely be limited in application. A quartz chamber is only suited for relatively low temperatures, that is much lower than most nanostructure synthesis processes. In addition to flexibility issues with processing, there are also safety concerns such as radiation through the quartz when the sample is at sufficiently elevated temperatures. There are also maximum temperatures that the quartz chamber can withstand without the addition of significant heat shielding.

BRIEF DESCRIPTION OF THE DRAWINGS

In order to more extensively describe some embodiment(s) of the present invention, reference is made to the accompanying drawings. These drawings are not to be considered limitations in the scope of the invention, but are merely illustrative.

DETAILED DESCRIPTION OF EMBODIMENTS OF THE INVENTION

Figure 1A:
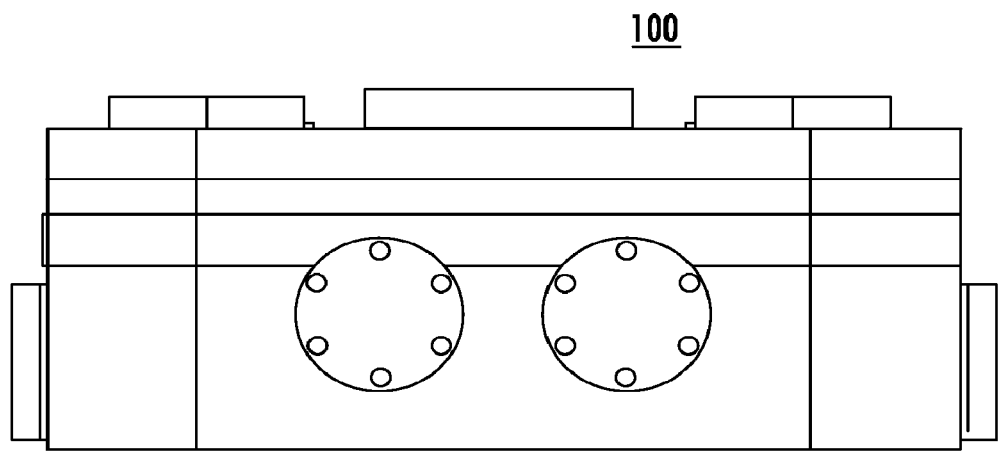
FIGS. 1A and 1B are schematic diagrams, respectively, of the exterior and interior (via cut-away view) of a chamber according to an embodiment of the present invention.

The description and the drawings of the present document refer to examples of embodiment(s) of the present invention and also describe some exemplary optional feature(s) and/or alternative embodiment(s). It will be understood that the embodiments referred to are for the purpose of illustration and are not intended to limit the invention specifically to those embodiments. Rather, the invention is intended to cover all that is included within the spirit and scope of the invention, including alternatives, variations, modifications, equivalents, and the like.

Some embodiments of the present invention may include, or be included in, or be combined with, or be configured for use with, or be configured for using, or be better understood with reference to, any systems and methods described in the following co-owned patent applications, which are hereby incorporated by reference in their entireties for all purposes:

U.S. patent application Ser. No. 10/613,513, filed Jul. 3, 2003, entitled "Apparatus and Method for Fabrication of Nanostructures Using Multiple Prongs of Radiating Energy";

U.S. patent application Ser. No. 10/613,217, filed Jul. 3, 2003, entitled "Apparatus and Method for Fabrication of Nanostructures Using Decoupled Heating of Constituents;

U.S. patent application Ser. No. 10/654,599, filed Sep. 2, 2003, entitled "Apparatus and Method for Actuating or Maintaining a Seal by Differential Pressure;

U.S. patent application Ser. No. 10/773,755, filed Feb. 2, 2004, entitled "Apparatus and Method for Single-Sided Loading of a Furnace or Other Process Station; and U.S. Provisional Patent App. 60/552,832, filed Mar. 13, 2004, entitled "Graphical User Interface For Controlling Materials Processing.

While hot wall reactors are capable of producing quality nanostructures, there are several disadvantages to the process. In hot wall CVD, the entire reactor is heated to high temperatures. This causes all of the species in the reactor, including gases, solids, substrate and/or catalyst to be heated to elevated temperatures. The thermals involved are all strongly coupled and some control and flexibility is lost. Heating times are also generally slow and thermal cycles can last several hours. This is particularly a problem with temperatures above 1100 degrees Centigrade, where cooling times are very long before the samples can be removed from the chamber. At these high temperatures, special materials such as molybdenum silicide or silicon carbide are also required. Hot wall systems such as tube furnaces become even less efficient and capable as the substrate size is enlarged. For instance, large silicon wafer substrates require an extreme amount of heating for the entire chamber which is inefficient. Larger volumes of gases are also usually required as the chamber size increases in these large tube furnaces, such as 6 inch outer diameter and larger.

In one embodiment of the present invention a stage heater is housed within a metal chamber, and the stage heater is used as the primary heating source for the synthesis of nanostructures. Examples of nanostructures include nanowires, nanorods, nanoribbons, SWNT, DWNT, non-carbon nanotubes, and the like. The stage heater may include or be primarily made of pyrolytic boron nitride (PBN), pyrolytic graphite, silicon carbide, molybdenum, or metal, or the like, or a combination thereof. The substrate can be any material, including a semiconducting wafer or piece, a ceramic or quartz substrate, or a boat containing a powder or solid material, or the like. The substrate can be in direct contact with the heater, which is especially preferable for when required temperatures are higher (e.g. up to 1600 degrees Centigrade). Alternatively, the substrate can be separated from the heater surface by an intermediate layer comprising quartz, alumina, sapphire, silicon, silicon nitride, molybdenum, tungsten, nickel, copper, aluminum, or tantalum, or the like. Nanostructure precursor materials may be gaseous, liquid, or solid. Gases may be preheated or subjected to high energy such as RF plasma or microwave plasma before reaching the substrate. Liquids may be supplied by bubblers, flash evaporators, direct liquid injection, vapor mass flow controllers, metering valves, pumps, or the like, or combinations thereof. Solid targets may be thermal treated or ablated with a laser source or similarly treated. The operation of the system may be computer controlled. The apparatus may include a load lock. The system can operate at or near atmospheric pressure or down to 10^-6 Torr. The chamber can be configured to be capable of base pressure of down to 10^-10 Torr. Heat shields may be used to focus, direct, and/or reflect stray energy, especially when very high temperatures are required.

In one embodiment of the present invention there are multiple stage heaters or multiple heating zones on a stage heater. This allows for multiple substrates or precursors in the chamber for the synthesis of nanostructures. For example, a two stage heater system is used to heat a boat containing a solid nanostructure precursor and a second heater, downwind of the first, is used to heat a substrate for deposition of the nanostructures.

In one embodiment of the present invention a shroud or cover is placed within the metal chamber and is capable of acting to direct gas flow through the system, prevent or reduce contamination on the metal chamber, maintain vapor pressure or concentration of reactive species in a reduced chamber volume, or the like. The cover can partially or completely cover the substrate and stage heaters. Some sections of the shroud or cover will likely be at a lower temperature than the substrate and stage heater, and can act as a cold wall to collect excess vapor, metal particles, nanostructures, and amorphous materials. The cover can be used to reduce or prevent contamination on the metal chamber. The shroud or cover is preferably easily mountable, changeable, and removable. Different shrouds or covers can be used for different or non-compatible processes, so that multiple types of materials can be synthesized in the same metal chamber in an economical way that does not require excessive cleaning between the processes.

In one embodiment of the present invention the apparatus contains at least one optical port. The optical port may be glass, quartz, sapphire or other suitable material. The optical port may allow microscopy, spectroscopy, or other in situ characterization techniques of the nanostructures within the chamber before, during, or after synthesis. For instance, Raman spectroscopy can be used during nanostructure synthesis to gain information on growth condition, growth rates, and overall understanding of nanostructure synthesis.

In one embodiment of the present invention the apparatus is contained partially or completely within a secondary enclosure. The enclosure may be exhausted to another area or to an exhaust abatement system. The exhausted enclosure is particularly useful for more dangerous gases such as those used in some nanowire or nanorod synthesis methods, or for the materials used in MOCVD methods.

In one embodiment of the present invention there are safety considerations for operation of the apparatus in the synthesis of nanostructures. This is particularly useful for nanowire or nanorod synthesis or MOCVD methods. The safety features include one or more of toxic gas sensors, smoke detectors, metal organic source detectors, temperature probes, and the like. A computer may be used to monitor the safety features before, during, and after synthesis.

The schematic drawings further illustrate an embodiment and some alternative embodiments of the present invention, as are the use of the apparatuses and as are the products produced by the apparatuses or produced by the methods.

Figure 1B:
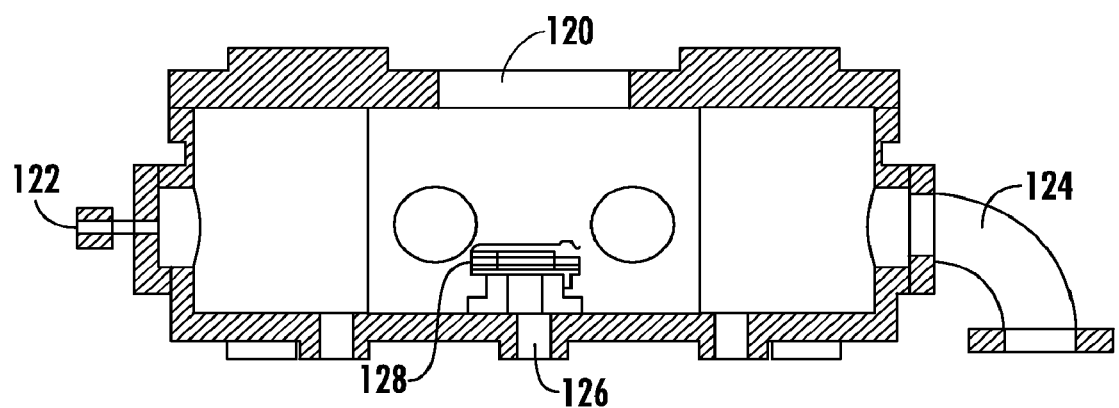

FIGS. 1A and 1B are schematic diagrams, respectively, of the exterior and interior (via cut-away view) of a chamber 100 (e.g., metal chamber) according to an embodiment of the present invention. The chamber 100 includes features, e.g., some of the following: optical viewport 120, gas inlet 122 with optional pre-heating, gas exhaust 124 to pump/vacuum, electronics feedthroughs 126 for heater 128 and thermocouples, and other connections, and the like.

Figure 2A:
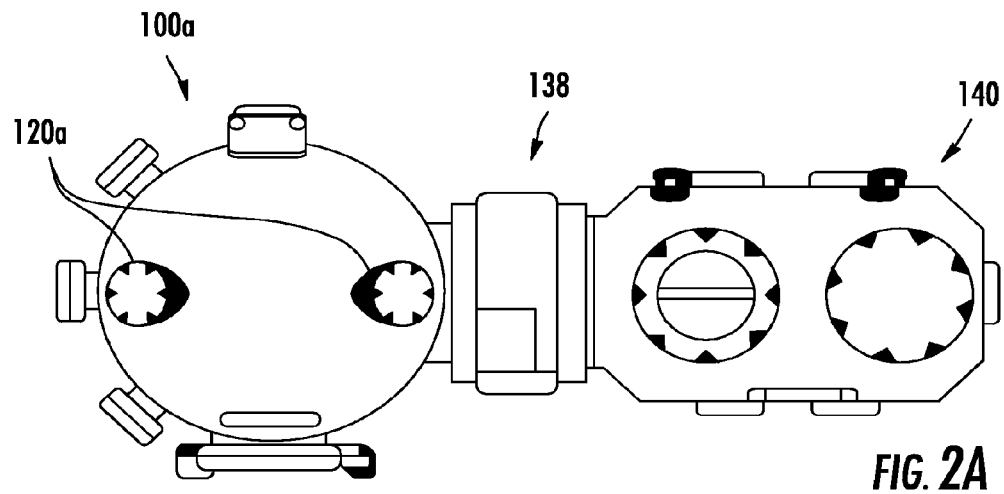
FIGS. 2A and 2B are schematic diagrams, respectively, of two views of a chamber according to an embodiment of the present invention.
Figure 2B:
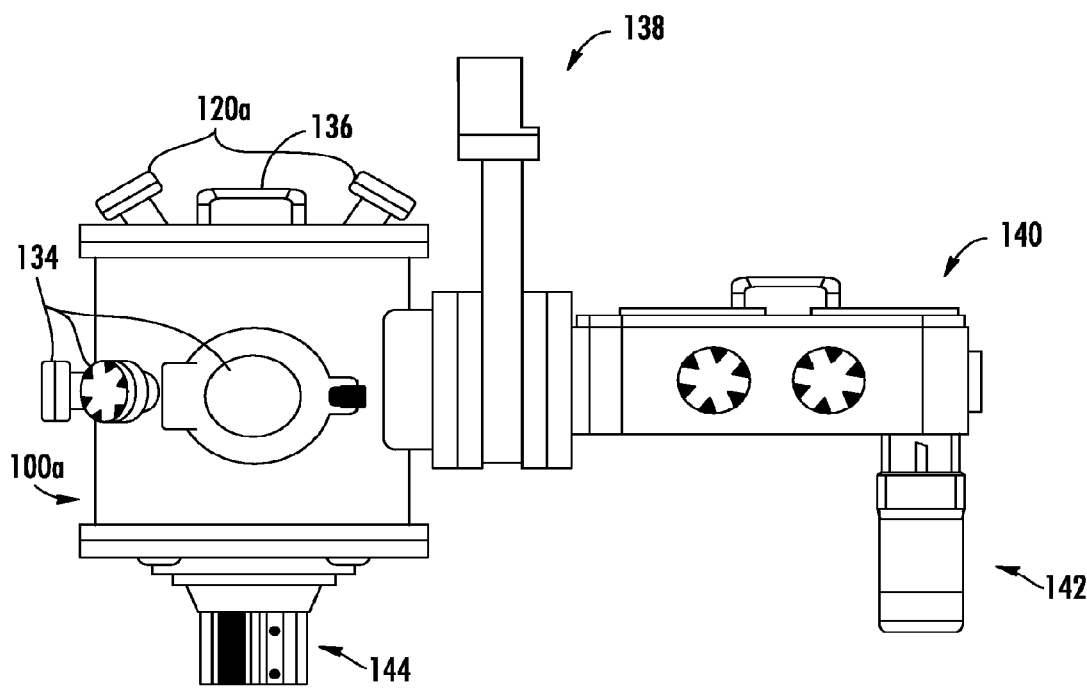

FIGS. 2A and 2B are schematic diagrams, respectively, of a top view and a side view of a reactor chamber 100a according to an embodiment of the present invention. The chamber 100a includes features, e.g., some of the following: optical viewports 120a, access ports 134, a gas path (not specifically shown) that lets gas into the chamber 100a from top and exhausts gas from bottom, e.g., with gases coming in through a showerhead or the like. The chamber 100a includes a lid, including a lid handle 136. Optionally, there is a gate valve 138 coupled to a load lock chamber 140. Optionally, there is a loader with motorized control 142. Optionally, there is a stage with motorized control 144.

Figure 3:
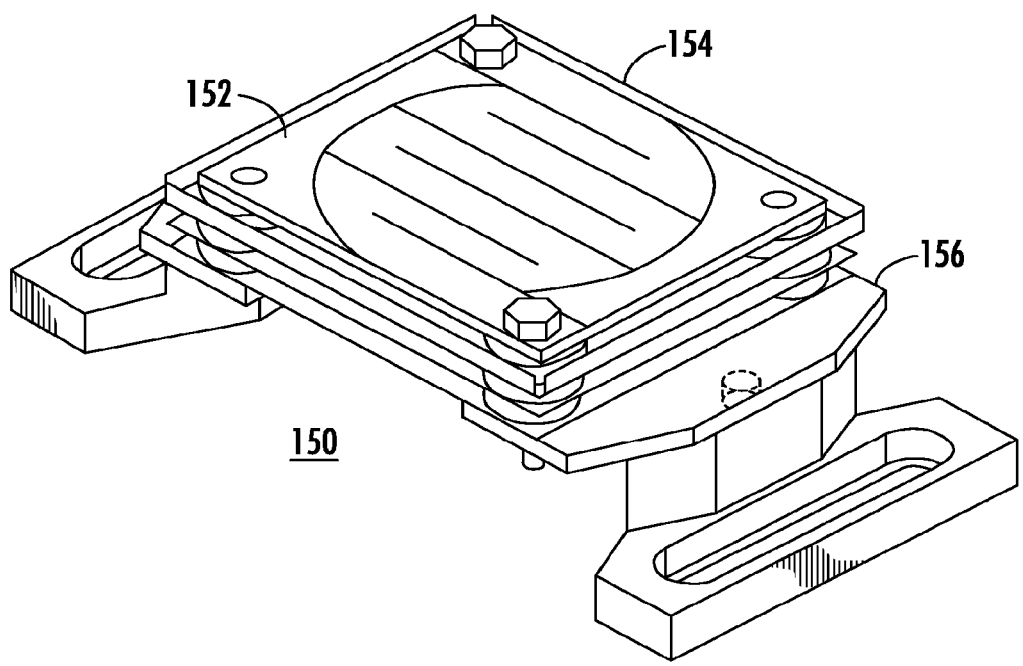
FIG. 3 is a schematic diagram of an example heater according to an embodiment of the present invention.

FIG. 3 is a schematic diagram of an example heater assembly 150 according to an embodiment of the present invention. The substrate may be on in PBN or the like. The heater assembly 150 includes a stage heater 152, e.g., a resistive heater, and may include a heat shield assembly 154, e.g., with multiple layers atop a base thermal isolation layer 156.

Figure 4:
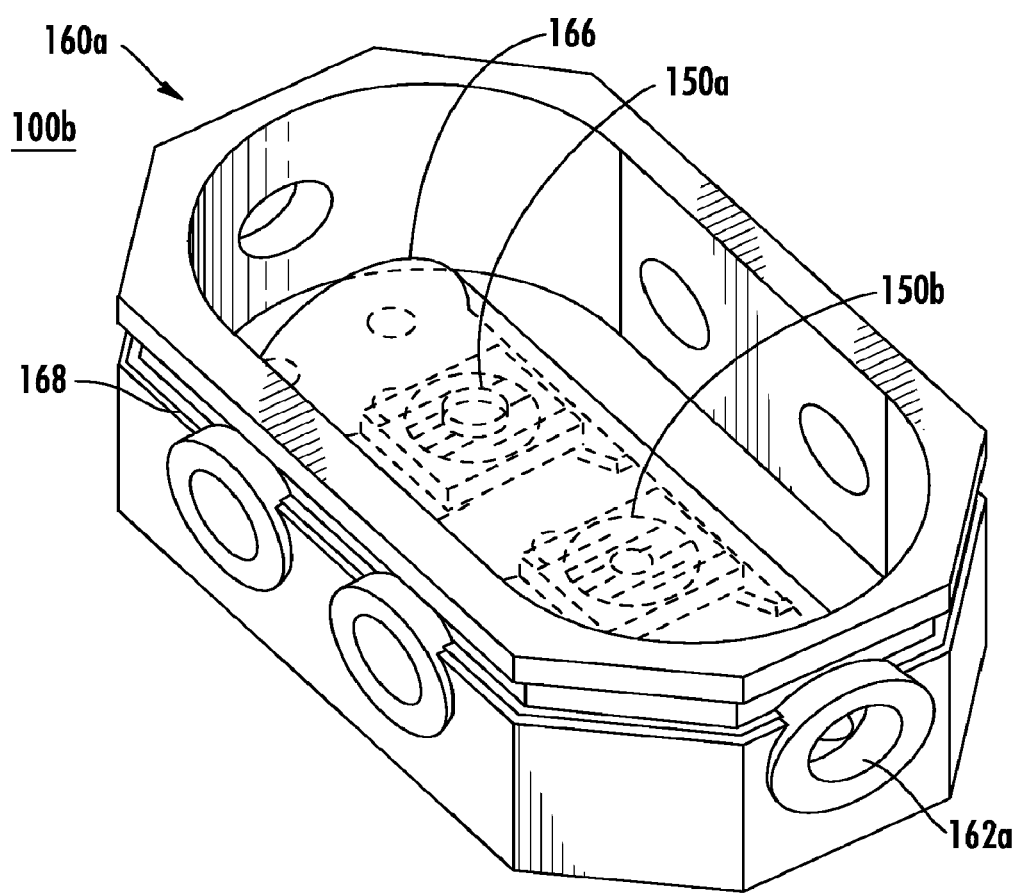
FIG. 4 is a schematic diagram of a perspective view of an opened chamber showing example features, including multi-zones, optional shroud, and other features.

FIG. 4 is a schematic diagram of a perspective view of an opened chamber 100b, e.g., a chamber similar to the chamber 100 of FIGS. 1A and 1B, or 2A and 2B, showing example features, including multi-zones, optional shroud, and other features. Many embodiments can exist, to include various features, e.g., some of the following: multi- (e.g., two-) heater design, gas inlet 160a and exhaust 162a, an optional shroud 166 (e.g., of quartz or ceramic or metal or the like), a fluid (e.g., water) cooling channel 168 (e.g., groove or tube) that contacts (e.g., encircles) the chamber to help cool it. The multi-heater design may include, e.g., a first heater 150*a* and a second heater 150*b*. For example, there may be a substrate (e.g. silicon with catalyst) placed on the second heater 150*b* and solid source in a boat (e.g., precursor, upwind) on the first heater 150*a*. The gas nozzle or line can extend into shroud coverage, and multiple (e.g, all (both)) heaters may be inside the shroud 166.

Figure 5:
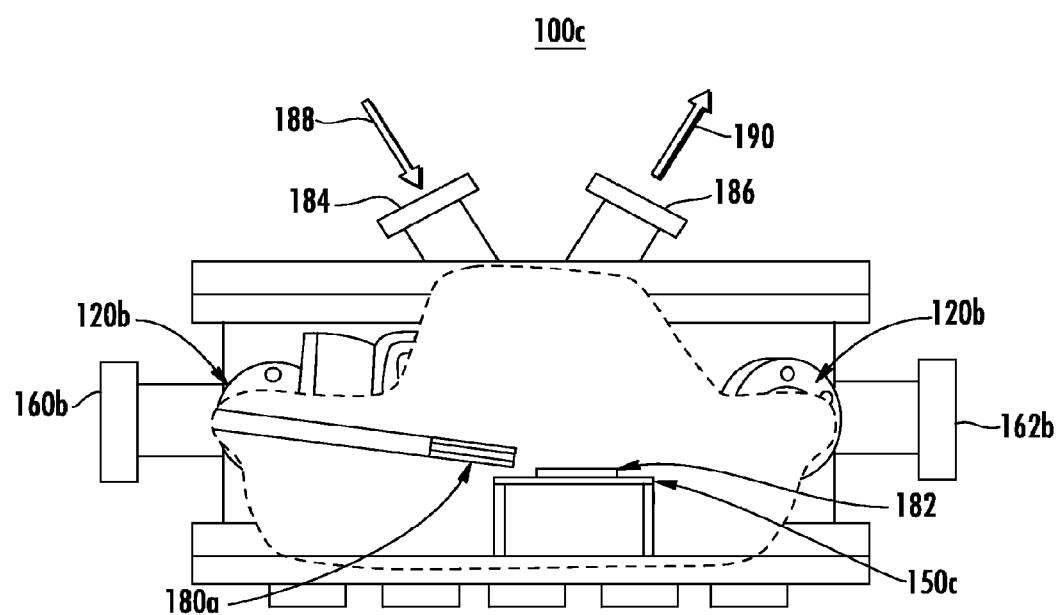
FIG. 5 is a schematic diagram of that shows portions of the exterior and interior (via cut-away view) of a chamber.

FIG. 5 is a schematic diagram of that shows portions of the exterior and interior (via cut-away view) of a chamber 100*c*, e.g., a chamber similar to the chamber of FIGS. 1A and 1B, or 2A and 2B. The chamber 100*c* can be configured for in situ Raman or other general laser spectroscopy, with ability to monitor process during the synthesis. Features may include, e.g., a gas inlet 160*b* and exhaust 162*b*, a gas line heater 180*a*, a stage heater 150*c*, substrate 182, optical viewports 120, opening(s) 184 and/or 186 for an input laser beam 188 and a reflected or output laser beam 190.

Figure 6:
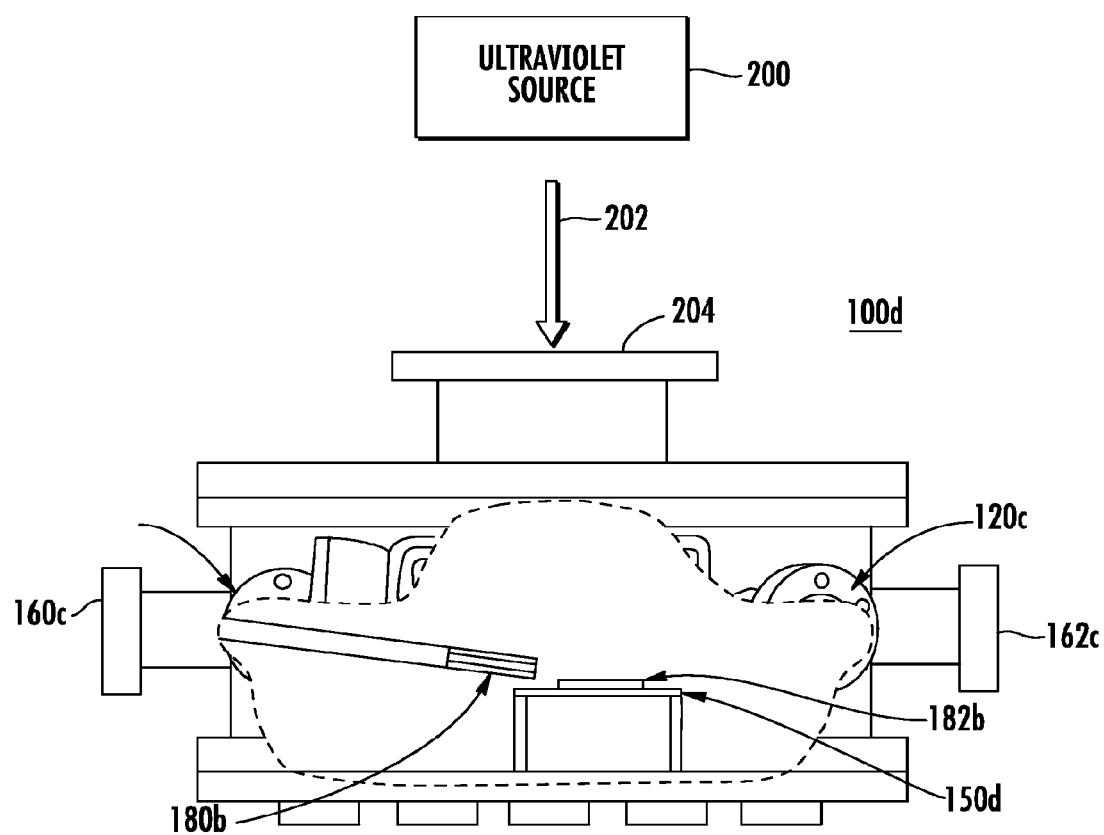
FIG. 6 is a schematic diagram of that shows portions of the exterior and interior (via cut-away view) of a chamber configured for use of an ultraviolet source.

FIG. 6 is a schematic diagram of that shows portions of the exterior and interior (via cut-away view) of a chamber 100*d*, e.g., a chamber similar to the chamber of FIGS. 1A and 1B, or 2A and 2B. The chamber 100*d* is configured for use of an ultraviolet source 200 that conveys ultraviolet radiation 202 into the chamber 100*d* via a port 204, e.g., for UV flooding for surface treatment which can be done before, during, or after synthesis. Other features of the chamber 100*d* may be similar to similarly numbered features previously described, e.g., viewports 120*c*, gas inlet 160*c*, gas outlet 162*c*, gas line heater 180*b*, substrate heater 150*d* and substrate 182*b*.

Figure 7:
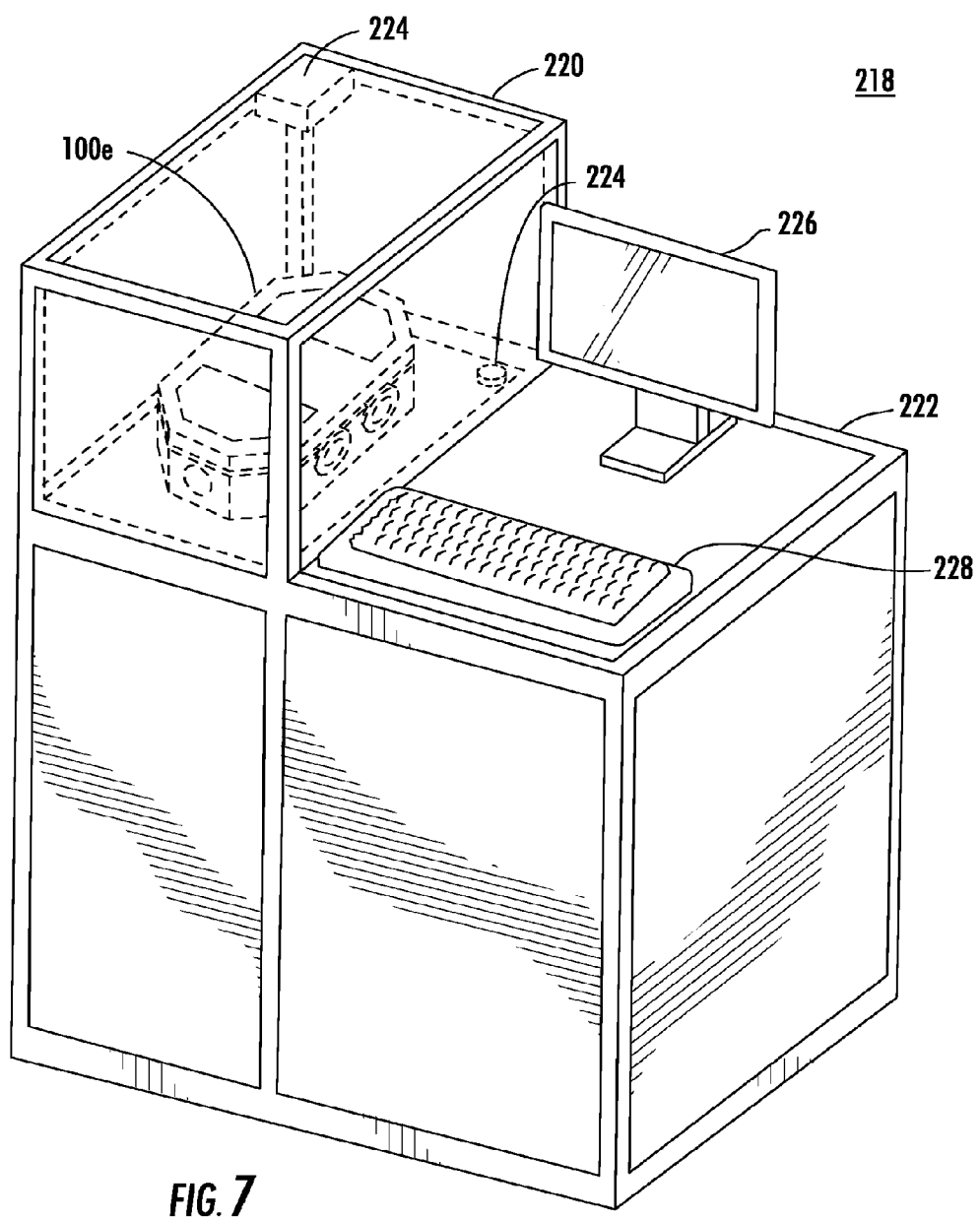
FIG. 7 is a schematic diagram showing a perspective view of a system, according to an embodiment of the present invention, that includes an enclosure and stand and sensors and exhaust.

FIG. 7 is a schematic diagram showing a perspective view of a system 218, according to an embodiment of the present invention, that includes a chamber 100*e* secondary enclosure 220, a stand 222, sensors 224, user interface indicators 226 (e.g., computer display), user input device(s) 228 (e.g., computer keyboard and/or pointer device), computer-control hardware and software, and exhaust.

Below, specific example embodiments and configurations are described. The following description, and the above description, in describing apparatuses and portions thereof, also include language that describe associated methods and method steps. The methods are also embodiments of the present invention.

EX-1. An apparatus for the synthesis of nanostructures, the apparatus comprising:
 a metal chamber
 at least one stage to support a substrate, where the stage heater is within the chamber and is resistively heated and is the primary source of heating of the substrate
 stage heating electronics and control
 where the nanostructures are one or more of nanowires, nanoribbons, nanorods, single-walled carbon nanotubes, double-walled carbon nanotubes, or non-carbon nanotubes.

EX-2. An apparatus according to example embodiment EX-1, wherein chemical vapor deposition (CVD) is used to synthesize the nanostructures.

EX-3. An apparatus according to example embodiment EX-1, wherein CVD, LPCVD, or MOCVD is used to synthesize the nanostructures.

EX-4. An apparatus according to example embodiment EX-1, wherein the metal chamber comprises stainless steel or aluminum.

EX-5. An apparatus according to example embodiment EX-1, wherein the metal chamber has at least one optical viewport which is glass, quartz, sapphire or other competent material.

EX-6. An apparatus according to example embodiment EX-1, wherein the apparatus is designed to allow in situ characterization at any stage of nanostructure synthesis.

EX-7. An apparatus according to example embodiment EX-6, wherein the characterization is microscopy, spectroscopy, Raman spectroscopy, laser diffractometry, infrared spectroscopy, or UV-Visible spectroscopy.

EX-8. An apparatus according to example embodiment EX-1, wherein the inside of the metal chamber is exposed to external light or energy sources through an optical viewport.

EX-9. An apparatus according to example embodiment EX-8, wherein the external source is UV, IR, or visible.

EX-10. An apparatus according to example embodiment EX-9, wherein the external source is used for surface treatment of the substrate and/or nanostructures at any stage of nanostructure synthesis.

EX-11. An apparatus according to example embodiment EX-1, wherein a laser is used to heat or ablate a solid target precursor though an optical port.

EX-12. An apparatus according to example embodiment EX-1, wherein the stage heater can heat a substrate from room temperature up to approximately 1600 degrees Centigrade.

EX-13. An apparatus according to example embodiment EX-1, wherein the stage heater can heat a substrate from room temperature up to approximately 1200 degrees Centigrade.

EX-14. An apparatus according to example embodiment EX-1, wherein the stage heater comprises pyrolytic boron nitride, pyrolytic graphite, silicon carbide, molybdenum, or metal.

EX-15. An apparatus according to example embodiment EX-1, wherein the stage heater provides heating of the substrate to within 5% uniformity.

EX-16. An apparatus according to example embodiment EX-1, wherein the stage heater provides heating of the substrate to within 2% uniformity.

EX-17. An apparatus according to example embodiment EX-1, wherein the substrate is in direct contact with the stage heater surface.

EX-18. An apparatus according to example embodiment EX-1, wherein there is an intermediate layer between the substrate and the heater surface.

EX-19. An apparatus according to example embodiment EX-18, wherein the intermediate layer comprises quartz, alumina, sapphire, silicon, silicon nitride, molybdenum, tungsten, nickel, copper, aluminum, or tantalum.

EX-20. An apparatus according to example embodiment EX-1, wherein there are more than one stage heater in the metal chamber.

EX-21. An apparatus according to example embodiment EX-1, wherein at least one heat shield is near the stage heater.

EX-22. An apparatus according to example embodiment EX-1, wherein the at least one optical viewports are protected by active cooling or one or more shutters.

EX-23. An apparatus according to example embodiment EX-22, wherein the active cooling is air, gas, water, or liquid cooling.

EX-24. An apparatus according to example embodiment EX-1, wherein the at least one optical viewport is protected by inert gas flow within the chamber.

EX-25. An apparatus according to example embodiment EX-1, wherein the chamber is externally heated to a temperature lower than the stage heater.

EX-26. An apparatus according to example embodiment EX-1, wherein the chamber is externally cooled by air, gas, water, or liquid.

EX-27. An apparatus according to example embodiment EX-1, wherein at least one pump is used to reduce the pressure in the chamber to lower than atmospheric pressure.

EX-28. An apparatus according to example embodiment EX-27, wherein the pressure inside the chamber is reduced to $10^{-3}$ Torr or greater.

EX-29. An apparatus according to example embodiment EX-27, wherein the pressure inside the chamber is reduced to $10^{-6}$ Torr or greater.

EX-30. An apparatus according to example embodiment EX-1, wherein the chamber is capable of pressures as low as $10^{-10}$ Torr.

EX-31. An apparatus according to example embodiment EX-1, wherein the operating pressure of the apparatus is from $10^{-3}$ Torr to 2 Torr.

EX-32. An apparatus according to example embodiment EX-1, wherein the operating pressure of the apparatus is from $10^{-3}$ Torr to approximately 700 Torr.

EX-33. An apparatus according to example embodiment EX-1, wherein apparatus is operated at or near atmospheric pressure.

EX-34. An apparatus according to example embodiment EX-1, wherein the at least one stage heater and materials and substrates on the heater is partially or completely covered by a quartz, glass, ceramic, or metal shroud.

EX-35. An apparatus according to example embodiment EX-34, wherein the shroud is used to partially direct the gas or vapor through the chamber.

EX-36. An apparatus according to example embodiment EX-34, wherein the shroud is easily mountable, changeable, or removable.

EX-37. An apparatus according to example embodiment EX-34, wherein at least some sections of the shroud are at a lower temperature than the stage heater and acts as a cold wall.

EX-38. An apparatus according to example embodiment EX-37, wherein deposition on the cold wall sections of the shroud reduce deposition on the metal chamber and stage heater.

EX-39. An apparatus according to example embodiment EX-1, wherein the nanostructure precursors comprise at least one of a gas, liquid, or solid or combinations thereof.

EX-40. An apparatus according to example embodiment EX-39, wherein the at least one gas includes hydrocarbons, CO, silane, phoshine, disilane, borane, diborane, arsine, germane, argon, hydrogen, helium, nitrogen, oxygen, ammonia, or silicon tetrachloride.

EX-41. An apparatus according to example embodiment EX-39, wherein liquid delivery into the chamber comprises one or more bubblers, flash evaporators, direct liquid injection, vapor mass flow controllers, metering valves, pumps, or combinations thereof.

EX-42. An apparatus according to example embodiment EX-39, wherein the solid precursor comprises Ga, Ge, Si, In, P, N, C, Au, Sn, Ni, Ag, Co, Al, As, or combinations thereof.

EX-43. An apparatus according to example embodiment EX-42, wherein the solid precursor is heated by a stage heater.

EX-44. An apparatus according to example embodiment EX-39, wherein the at least one gas or vapor precursors flows through a remote plasma apparatus before entering the metal chamber.

EX-45. An apparatus according to example embodiment EX-44, wherein the remote plasma source is RF or microwave.

EX-46. An apparatus according to example embodiment EX-1, wherein the at least one gas is heated before reaching the stage heater and substrate.

EX-47. An apparatus according to example embodiment EX-46, wherein the gas is heated by contact with a resistive heater.

EX-48. An apparatus according to example embodiment EX-47, wherein the resistive heater comprises pyrolytic boron nitride, pyrolytic graphite, silicon carbide, molybdenum, or metal.

EX-49. An apparatus according to example embodiment EX-1, wherein a loadlock is attached to the metal chamber.

EX-50. An apparatus according to example embodiment EX-1, wherein toxic gas sensors are used during operation of the apparatus.

EX-51. An apparatus according to example embodiment EX-1, wherein smoke detectors are used during operation of the apparatus.

EX-52. An apparatus according to example embodiment EX-1, wherein combustible gas detectors are used during operation of the apparatus.

EX-53. An apparatus according to example embodiment EX-1, wherein detectors for metal organic sources are used during operation of the apparatus.

EX-54. An apparatus according to example embodiment EX-1, wherein pressure or flow sensors are used during operation of the apparatus.

EX-55. An apparatus according to example embodiment EX-1, wherein temperature probes are used inside and outside the metal chamber.

EX-56. An apparatus according to example embodiment EX-1, wherein operation of the apparatus is partially or completely controlled by computer.

EX-57. An apparatus according to example embodiment EX-56, wherein the computer controls one or more of the following: gas delivery, liquid delivery, mass flow controllers, stage heaters, gas heaters, remote plasma source, loading, loadlock, pressure, vacuum components, electric fields, magnetic fields EX-58. An apparatus according to example embodiment EX-1, wherein the apparatus is directly connected to mass spectrometers, residual gas analyzers, microscopy equipment, measurement equipment, or other characterization equipment.

EX-59. An apparatus according to example embodiment EX-1, wherein electric or magnetic fields at or near the substrates are used during synthesis of nanostructures.

EX-60. An apparatus according to example embodiment EX-1, wherein the entire chamber is housed within a secondary enclosure.

EX-61. An apparatus according to example embodiment EX-60, wherein the area around the chamber is exhausted away from the chamber.

Throughout the description and drawings, example embodiments are given with reference to specific configurations. It will be appreciated by those of ordinary skill in the art that the present invention can be embodied in other specific forms. The scope of the present invention, for the purpose of the present patent document, is not limited merely to the specific example embodiments of the foregoing description.

What is claimed is:
1. A device comprising:
 a chamber that is substantially metallic, wherein the chamber comprises a first side comprising a fluid inlet and a second side comprising a fluid outlet, the second side being opposite to the first side;
 a first stage, positioned within the chamber and between the first and second sides of the chamber, wherein the first stage comprises a first stage heater that is resistively heated and is a source of heating of a first solid material supported by the first stage; and a second stage, positioned within the chamber and between the first stage and the second side of the chamber, wherein the second stage comprises a second stage heater that is resistively heated and is a source of heating of a second solid material supported by the second stage, wherein a fluid entering the chamber through the fluid inlet on the first side of the chamber flows over the first stage and the second stage before exiting the chamber through the fluid outlet on the second side of the chamber, wherein the chamber comprises:

a first port on a third side of the chamber;

a second port on the third side;

a third port on a fourth side of the chamber, wherein the fourth side is opposite to the third side; and a fourth port, opposite the second port, on the fourth side, wherein the first, second, third, and fourth ports comprise at least one of silicon oxide or aluminum oxide.

2. The device of claim 1 wherein the first solid material supported by the first stage is a precursor, heated by the first stage heater, the second solid material supported by the second stage is a substrate, heated by the second stage heater, and the fluid entering via the fluid inlet flows over the precursor before flowing over the substrate and exiting the chamber via the fluid outlet.

3. The device of claim 1 wherein an interior space defined by the chamber is sealed from an exterior of the chamber and the device further comprises:

a pump, coupled to the chamber, wherein the pump is capable of reducing and maintaining a pressure of the interior of the chamber to a pressure lower than an atmospheric pressure at the exterior of the chamber.

4. The device of claim 1 wherein the chamber comprises:

a fifth port; and a sixth port, wherein the fifth and sixth ports are above the first and second stage and the sixth port is positioned relative to the fifth port so a light source directed into the fifth port into the chamber can be reflected from within the chamber out through the sixth port.

5. The device of claim 4 wherein the light source is a laser beam and the fifth port is positioned relative to the first stage so that the laser beam can be directed into the fifth port to ablate the first solid material supported by the first stage.

6. A device comprising:

a chamber that is substantially metallic, wherein the chamber comprises a first side comprising a fluid inlet and a second side comprising a fluid outlet, the second side being opposite to the first side;

a first stage, positioned within the chamber and between the first and second sides of the chamber, wherein the first stage comprises a first stage heater that is resistively heated and is a source of heating of a first solid material supported by the first stage; and a second stage, positioned within the chamber and between the first stage and the second side of the chamber, wherein the second stage comprises a second stage heater that is resistively heated and is a source of heating of a second solid material supported by the second stage, wherein a fluid entering the chamber through the fluid inlet on the first side of the chamber flows over the first stage and the second stage before exiting the chamber through the fluid outlet on the second side of the chamber, and wherein the second stage heater comprises a heater surface, a base thermal isolation layer, and a heat shield assembly layer atop the base thermal isolation layer to direct heat towards the heater surface.

7. The device of claim 6 wherein a fluid flowing into the fluid inlet flows over the first stage and then the second stage before exiting through the fluid.

8. A system comprising:

a computer display, placed on a stand;

the device of claim 6 placed on the stand, wherein the computer display and the device are elevated by the stand above a floor of a room in which the system is located; and an enclosure, placed over the device, separating the device from the computer display.

9. The system of claim 8 comprising a computer keyboard placed on the stand.

10. A device comprising:

a chamber that is substantially metallic, wherein the chamber comprises a first side comprising a fluid inlet and a second side comprising a fluid outlet, the second side being opposite to the first side;

a first stage, positioned within the chamber and between the first and second sides of the chamber, wherein the first stage comprises a first stage heater that is resistively heated and is a source of heating of a first solid material supported by the first stage;

a second stage, positioned within the chamber and between the first stage and the second side of the chamber, wherein the second stage comprises a second stage heater that is resistively heated and is a source of heating of a second solid material supported by the second stage, wherein a fluid entering the chamber through the fluid inlet on the first side of the chamber flows over the first stage and the second stage before exiting the chamber through the fluid outlet on the second side of the chamber; and a lid having a lid handle, wherein the lid is adapted to seal a top opening the chamber, thereby covering the first and second stages, and when the lid is opened, the first solid material and second solid material can be placed into or removed from the chamber through the top opening of the chamber.

11. A device comprising:

a chamber that is substantially metallic, wherein the chamber comprises a first side comprising a fluid inlet and a second side comprising a fluid outlet, the second side being opposite to the first side;

a first stage, positioned within the chamber and between the first and second sides of the chamber, wherein the first stage comprises a first stage heater that is resistively heated and is a source of heating of a first solid material supported by the first stage;

a second stage, positioned within the chamber and between the first stage and the second side of the chamber, wherein the second stage comprises a second stage heater that is resistively heated and is a source of heating of a second solid material supported by the second stage, wherein a fluid entering the chamber through the fluid inlet on the first side of the chamber flows over the first stage and the second stage before exiting the chamber through the fluid outlet on the second side of the chamber;

a lid which is adapted to seal a top opening the chamber, thereby covering the first and second stages; and a single-piece shroud comprising silica, wherein the shroud is mountable inside an interior space of the metallic chamber and removable through the top opening of the chamber, and when mounted in the chamber, the shroud at least partially covers the first stage and the second stage.

12. The device of claim 11 comprising:
a gas nozzle, extending from the fluid inlet of the chamber, wherein a tip of the gas nozzle is positioned above the first stage and underneath the shroud.

13. A device comprising:
a chamber that is substantially metallic, wherein the chamber comprises a first side comprising a fluid inlet and a second side comprising a fluid outlet, the second side being opposite to the first side;
a first stage, positioned within the chamber and between the first and second sides of the chamber, wherein the first stage comprises a first stage heater that is resistively heated and is a source of heating of a first solid material supported by the first stage; and
a second stage, positioned within the chamber and between the first stage and the second side of the chamber, wherein the second stage comprises a second stage heater that is resistively heated and is a source of heating of a second solid material supported by the second stage,
wherein a fluid entering the chamber through the fluid inlet on the first side of the chamber flows over the first stage and the second stage before exiting the chamber through the fluid outlet on the second side of the chamber, and
wherein the chamber defines and interior space of the chamber and the device further comprises a shroud, mountable inside an interior space of the chamber and removable from the interior space of the chamber.

14. A device comprising:
a chamber that is substantially metallic, wherein the chamber comprises a first side comprising a fluid inlet and a second side comprising a fluid outlet, the second side being opposite to the first side;
a first stage, positioned within the chamber and between the first and second sides of the chamber, wherein the first stage comprises a first stage heater that is resistively heated and is a source of heating of a first solid material supported by the first stage;
a second stage, positioned within the chamber and between the first stage and the second side of the chamber, wherein the second stage comprises a second stage heater that is resistively heated and is a source of heating of a second solid material supported by the second stage,
wherein a fluid entering the chamber through the fluid inlet on the first side of the chamber flows over the first stage and the second stage before exiting the chamber through the fluid outlet on the second side of the chamber;
a third port on a wall of the chamber, positioned above the first stage;
a shroud inside an interior space of the chamber, wherein the shroud comprises silica and is removably mounted between the third port and the first stage, and a light source directed into the third port passes through shroud to the first solid material supported by the first stage.

15. A device comprising:
a chamber comprising a bottom surface and first, second, third, and fourth chamber walls extending from the bottom surface, and edges of the first, second, third, and fourth chamber walls define a top opening for the chamber;
a fluid inlet port, formed on the first chamber wall;
a fluid outlet port, formed on the third chamber wall, wherein the third chamber wall is opposite to the first chamber wall;
a first port, formed on the second chamber wall;
a second port, formed on the fourth chamber wall, wherein the fourth chamber wall is opposite to the second chamber wall;
a lid adapted to cover and seal the top opening of the chamber;
a first stage, coupled to the bottom surface of the chamber, wherein the first stage comprises a first heater and is positioned between the first and third chamber walls; and
a second stage, coupled to the bottom surface of the chamber, wherein the second stage comprises a second heater and is positioned between the first stage and the third chamber walls,
wherein a fluid entering the chamber via the fluid inlet port flows over the first stage and then the second stage before exiting the chamber via the fluid outlet port.

16. The device of claim 15 wherein the first stage heater comprises:
a thermal isolation first layer;
a resistive heating second layer, above the first layer; and
a heater surface third layer, above the first and second layers, for holding a substrate.

17. The device of claim 15 wherein each of the first and second stage heaters each comprise:
a heater surface to contact one of a substrate or precursor;
a base thermal isolation layer; and
a heat shield assembly atop the base thermal isolation layer to direct heat towards the heater surface.

18. The device of claim 15 comprising a shroud to at least partially cover the first and second stages, wherein the shroud comprises a first material and the chamber comprises a second material, different from the first material.

19. A system comprising a computer display, a keyboard, and an enclosure, placed over the device of claim 15, separating from the device from the computer display and keyboard.

20. The device of claim 15 comprising:
a third port, formed on the lid, through which light can be emitted to strike a material supported by the first stage.

21. The device of claim 20 wherein the bottom surface, lid, first chamber wall, second chamber wall, third chamber wall, and third chamber wall comprise stainless steel,
the lid is opposite the bottom surface, and
the third port comprises silica.

22. The device of claim 15 wherein the second chamber wall joins the first and third chamber walls.

23. The device of claim 22 wherein the fourth chamber wall additionally joins the first and third chamber walls.

24. The device of claim 23 comprising:
a fluid nozzle, extending from the fluid inlet of the chamber, wherein a tip of the fluid nozzle is positioned over the first stage.

25. A device comprising:
a chamber comprising a fluid inlet, a fluid outlet, and at least one optical port;
at least one stage heater within the chamber;
a removable shroud within the chamber having a first shroud opening permitting flow of gas from the fluid inlet, across the at least one stage heater, through a second shroud opening, and to the fluid outlet; and
a lid atop the chamber, wherein the lid comprises a handle to lift the lid, thereby opening the chamber so that the removable shroud can be accessed, wherein the removable shroud comprises a first material, the chamber comprises a second material, different from the first material, the removable shroud at least partially covers the at least one stage heater, and the lid covers the removable shroud.

26. The device of claim 25 wherein the at least one stage heater is a first stage heater and the device comprises a second stage heater, wherein the removable shroud at least partially covers both the first and second stage heaters.

27. The device of claim 25 wherein the first material comprises ceramic and the second material comprises.

28. The device of claim 25 wherein the shroud touches a bottom surface of the chamber to define a shroud coverage region and the at least one stage heater is within the shroud coverage region.

29. The device of claim 25 wherein the chamber defines an undivided interior space and the shroud, and the at least one stage heater is within the undivided interior.

30. A device for the synthesis of nanostructures comprising:
   a metal chamber comprising a fluid inlet port and a fluid outlet port;
   a first stage heater to heat a precursor; and
   a second stage heater to heat a substrate, wherein the first and second stage heaters are housed within an interior space of the metal chamber, a fluid path is from the fluid inlet port, through the interior space, and to the fluid outlet port, the second stage heater is downwind of the first stage heater with respect to the fluid path, and each of the first and second stage heaters comprises:
   a heater surface;
   a base thermal isolation layer; and
   a heat shield assembly atop the base thermal isolation layer to direct heat towards the heater surface.

31. The device of claim 30 wherein the precursor is to be placed on the heater surface of the first stage heater and the substrate is to be placed on the heater surface of the second stage.

32. The device of claim 30 wherein the heater surface of the second stage heater comprises pyrolytic boron nitride.

33. The device of claim 30 wherein the metal chamber comprises:
   a first electronic feed-through opening below the first stage heater to permit electrical connections to be made to the first stage heater; and
   a second electronic feed-through opening below the second stage heater to permit electrical connections to be made to the second stage heater.

34. The device of claim 30 comprising a lid having a handle to lift the lid, thereby opening the metal chamber so that the precursor can be placed on the first stage heater and the substrate can be placed on the second stage heater.

35. The device of claim 30 wherein gas flowing from the fluid inlet port to the fluid outlet port flows above the heater surfaces of the first and second stage heaters.

36. The device of claim 30 comprising an intermediate layer placed on the heater surface of the second stage heater to separate the substrate from the heater surface of the second stage.

37. The device of claim 36 wherein the intermediate layer comprises a first material and the heater surface of the second stage heater comprises a second material, different from the first material.

38. The device of claim 37 wherein the first material comprises quartz and the second material comprises pyrolytic boron nitride.

* * * * *